US006468916B2

(12) United States Patent
Choi et al.

(10) Patent No.: US 6,468,916 B2
(45) Date of Patent: Oct. 22, 2002

(54) METHOD OF FORMING STRUCTURE HAVING SURFACE ROUGHNESS DUE TO NANO-SIZED SURFACE FEATURES

(75) Inventors: Jun-hee Choi, Kyungki-do; Seung-nam Cha, Seoul; Hang-woo Lee, Kyungki-do, all of (KR)

(73) Assignee: Samsung SDI Co., Ltd. (KR)

( * ) Notice: Subject to any disclaimer, the term of this patent is extended or adjusted under 35 U.S.C. 154(b) by 0 days.

(21) Appl. No.: 09/754,274

(22) Filed: Jan. 5, 2001

(65) Prior Publication Data

US 2001/0006851 A1 Jul. 5, 2001

(30) Foreign Application Priority Data

Jan. 5, 2000 (KR) ........................................ 00-363

(51) Int. Cl.[7] ........................................ H01L 21/302

(52) U.S. Cl. ...................... 438/706; 438/710; 438/712; 438/713

(58) Field of Search ............................ 438/706, 710, 438/712, 713, 714; 216/11, 42; 445/27, 30

(56) References Cited

U.S. PATENT DOCUMENTS 4,642,163 A 2/1987 Greschner et al.
5,578,185 A * 11/1996 Bergeron et al. ........... 205/123
5,637,189 A * 6/1997 Peeters et al. .............. 438/466
6,193,870 B1 * 2/2001 Morse et al. ............... 205/123

OTHER PUBLICATIONS

Yue Kuo, "Factors Affecting the Molybdenum Line Slope By Reactive Ion Etching", *Journal of the Electrochemical Society*, Electrochemical Society, Manchester, Jun. 1, 1990, pp. 1907–1911, vol. 137, No. 6, New Hampshire.

* cited by examiner

*Primary Examiner*—Benjamin L. Utech
*Assistant Examiner*—Lan Vinh
(74) *Attorney, Agent, or Firm*—Burns, Doane, Swecker & Mathis LLP

(57) ABSTRACT

A method of forming a micro structure having nano-sized surface features is provided. The method includes the steps of forming a micro structure having predetermined size and shape on a substrate, coating a carbon polymer layer on the substrate including the micro structure to a predetermined thickness, performing a first etch on the carbon polymer layer by means of plasma etching using a reactive gas in which $O_2$ gas for etching the carbon polymer layer and a gas for etching the micro structure are mixed and forming a mask layer by the residual carbon polymer layer on the surface of the micro structure, and performing a second etch by means of plasma etching using the mixed reactive gas to remove the mask layer and etch the surface of the micro structure not covered by the mask layer so that the micro structure has nano-sized surface features.

10 Claims, 7 Drawing Sheets

METHOD OF FORMING STRUCTURE HAVING SURFACE ROUGHNESS DUE TO NANO-SIZED SURFACE FEATURES

This application claims priority under 35 U.S.C. §§ 119 and/or 365 to Korean Application No. 00-363 filed Jan. 5, 2000; the entire content of which is hereby incorporated by reference.

BACKGROUND OF THE INVENTION

1. Field of the Invention

The present invention relates to a method of forming a micro structure having nano-sized surface features.

2. Description of the Related Art

Forming a micro structure requires precise fabrication technologies since the micro structure includes a plurality of miniaturized electronic components. Generally, a thin film is grown and formed on one substrate and physicochemically cut in a predetermined pattern at a specific step to obtain a micro structure having a desired structure. In some cases, a micro structure is formed by growing and forming thin films on two substrates, cutting them in predetermined patterns, and combining the two substrates into one.

Typically, a patterning process such as photolithography or plasma etching is applied to form a regularly-structured micro structure. Sometimes a micro structure having an irregular shape with a nano- or micro-sized features may be required. However, since conventional etching techniques are chiefly applied to regularly-shaped micro structures, it is difficult to obtain micro structure having an irregular shape with a nano- or micro-sized features.

For example, it is known that a micro tip having more edges, which is an electron emission source of a field emission display, is advantageous in electron emission over that a micro chip having a single electron emission edge, but effective fabrication techniques therefor has been not yet proposed.

Micro structures other than the micro tip may also require a structure having an irregular shape of a micro scale or a nano scale.

SUMMARY OF THE INVENTION

To solve the above problems, it is an objective of the present invention to provide a method of forming a micro structure having surface roughness due to nano-sized surface features.

Accordingly, to achieve the above objective, the present invention provides a method of forming a micro structure having surface roughness due to nano-sized surface features. The method includes the steps of forming a micro structure having predetermined size and shape on a substrate; coating a carbon polymer layer on the substrate including the micro structure to a predetermined thickness; performing a first etch on the carbon polymer layer by means of plasma etching using a reactive gas in which $O_2$ gas for etching the carbon polymer layer and a gas for etching the micro structure are mixed and forming a mask layer by the residual carbon polymer layer on the surface of the micro structure, and performing a second etch by means of plasma etching using the mixed reactive gas to remove the mask layer and etch the surface of the micro structure not covered by the mask layer so that the micro structure has nano-sized surface features.

Preferably, the carbon polymer layer is formed of polyimide or photoresist, and etched using reactive ion etching (RIE).

When etching the carbon polymer layer, the reactive gas is preferably composed of $O_2$ as a main component and at least one of fluorine-family gases such as $CF_4$, $SF_6$ and $CHF_3$ or composed of $O_2$ as a main component and at least one of chlorine-family gases such as $Cl_2$ and $CCl_4$. In particular, if the reactive gas contains fluorine-family gas, at least one of $CF_4/O_2$, $SF_6/O_2$, $CHF_3/O_2$, $CF_4/SF_6/O_2$, $CF_4/CHF_3/O_2$, and $SF_6/CHF_3/O_2$ is preferably applied. If the reactive gas contains chlorine-family gas, at least one of $Cl_2/O_2$, $CCl_4/O_2$, and $Cl_2/CCl_4/O_2$ is applied.

In etching the micro structure, an etch rate is preferably adjusted by at least one of plasma power, the $O_2$ content of the reactive gas with respect to the etch gas for etching the micro structure and a plasma process pressure, thereby controlling the surface roughness of the micro structure.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

Figure 1:
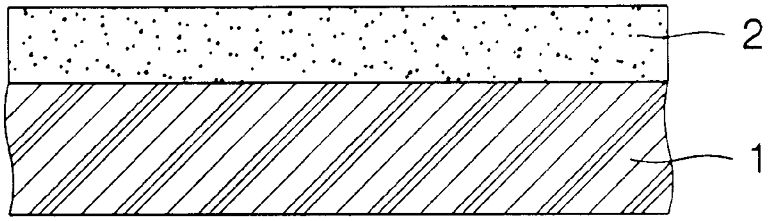
FIG. 1 shows a state in which a target layer is formed on a substrate according to a method of forming a micro structure under the present invention.

As shown in FIG. 1, a target layer 2 is formed on a substrate 1. Here, the target layer 2 is a portion to be formed as a micro structure according to a method of the present invention and may include one or a mixture of two or more selected among the group consisting of molybdenum (Mo), tungsten (W), silicon, and diamond.

Figure 2:
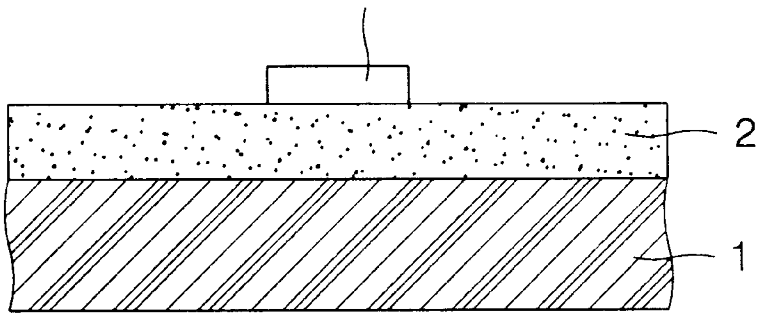
FIG. 2 shows a state in which a mask layer is formed on the target layer according to the method of forming a micro structure under the present invention.
Figure 3A:
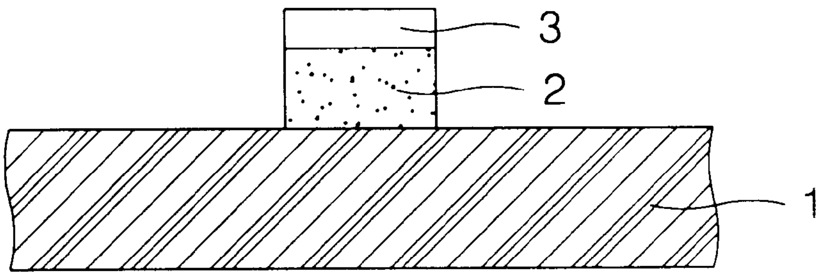
FIGS. 3A and 3B show states in which the target layer is etched according to the method of forming the micro structure under the present invention, respectively.
Figure 3B:
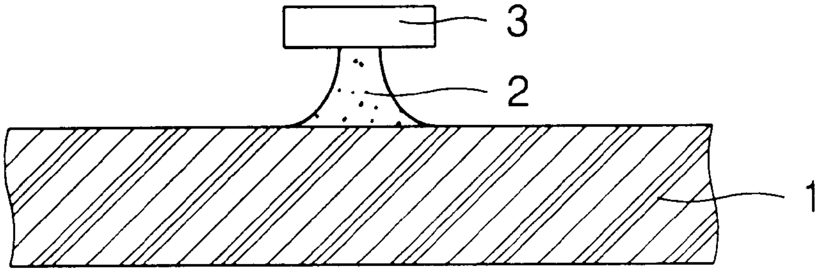

Referring to FIG. 2, a mask layer 3 having a predetermined pattern is formed on top of the target layer 2. As shown in FIGS. 3A–3B, isotropic or anisotropic etching is performed to remove a portion of the target layer 2 which is not covered by the mask layer 3. Here, FIGS. 3A and 3B show the results of anisotropic and isotropic etching, respectively.

Figure 4A:
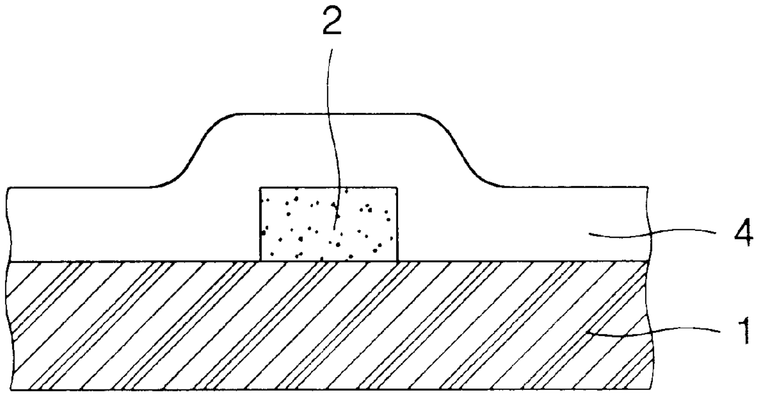
FIGS. 4A and 4B show states in which a carbon polymer layer is formed on the target layer according to the method of forming a micro structure under the present invention.
Figure 4B:
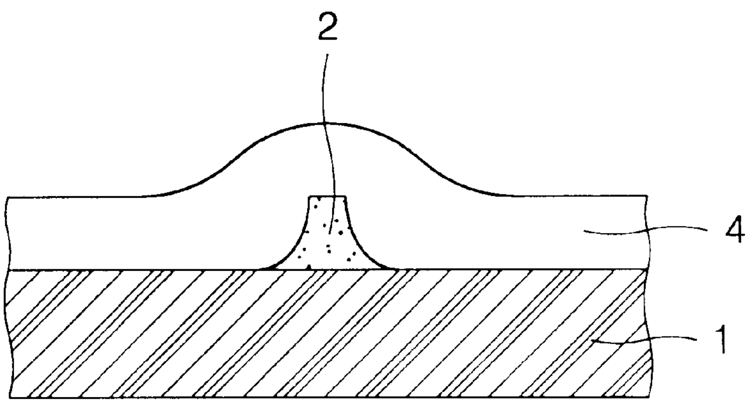

As shown in FIGS. 4A and 4B, following removal of the mask layer 3, a carbon polymer layer 4 is formed on the target layer 2. The carbon polymer layer 4 is formed of photoresist or polyimide by means of a spin coating technique. The carbon polymer layer 4 is formed through processes of spin coating, soft baking and curing while maintaining the thickness thereof in the range of 1–20 $\mu$m.

Figure 5A:
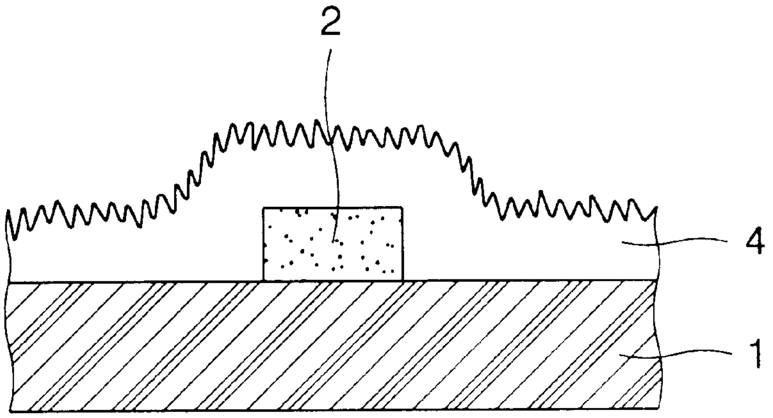
FIGS. 5A and 5B show a state in which the carbon polymer layer on the target layer is etched by an $O_2$ plasma to form a grass-like structure according to the method of forming a micro structure under the present invention.
Figure 5B:
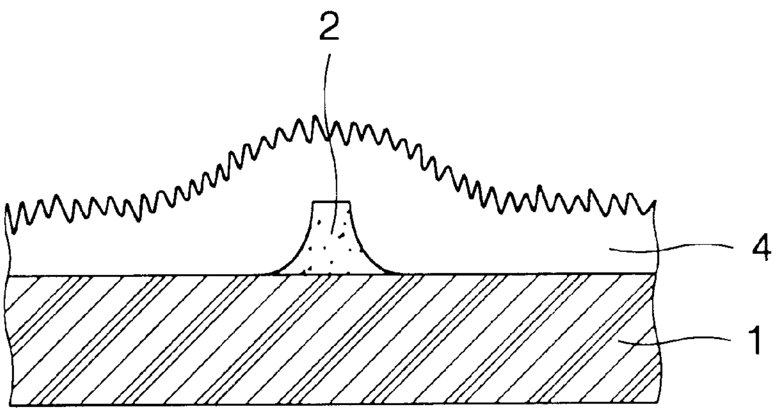

As shown in FIGS. 5A and 5B, dry etching is performed on the carbon polymer layer 4 through plasma etching, in particular, reactive ion etching (RIE). During plasma etching, a reactive gas may be composed of $O_2$ gas as a main component and fluorine-family gas such as $CF_4$, $CF_6$, and $CHF_3$. For example, the reactive gas may include at least one of $CF_4/O_2$, $SF_6/O_2$, $CHF_3/O_2$, $CF_4/SF_6/O_2$, $CF_4/CHF_3/O_2$, and $SF_6/CHF_3/O_2$. Also, the reactive gas may be a mixture of $O_2$ gas and chlorine-family gas. In this case, the reactive gas may include at least one of $Cl_2/O_2$, $CCl_4/O_2$, and $Cl_2CCl_4/O_2$.

During dry etching by $O_2$ plasma, the carbon polymer layer 4 is etched to form a grass-like structure as shown in FIGS. 5A and 5B. The grass-like structure refers to a structure having a finely rough etching surface due to variations in local etch rate. In this case, $O_2$ is added to fluorine- or chlorine-family gas so as to increase the etch rate of polyimide, that is, to facilitate etching of a top end of the target layer 2 when a micro tip of the target layer 2 is exposed to plasma as the carbon polymer layer 4 is etched. Here, in etching the carbon polymer layer 4, the etch rate of the target layer 2 by plasma is adjusted depending on the mol ratio of $O_2$ to fluorine- or chlorine-family gas, a process pressure, plasma power, and the like. Since the carbon polymer layer 4 is etched to form a grass-structure in this way, carbon polymer remains on a portion of the surface of the target layer 2 thereby acting as a mask for the target layer 2.

Figure 6A:
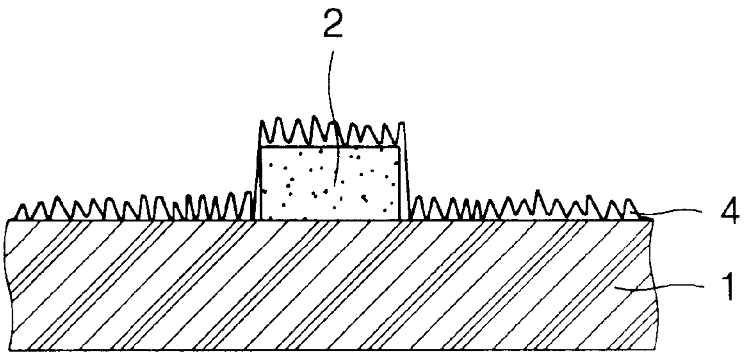
FIGS. 6A and 6B show a state in which the carbon polymer layer on the target layer is etched by the $O_2$ plasma to form the grass-like structure while remaining as a mask for the target layer according to the method of forming a micro structure under the present invention.
Figure 6B:
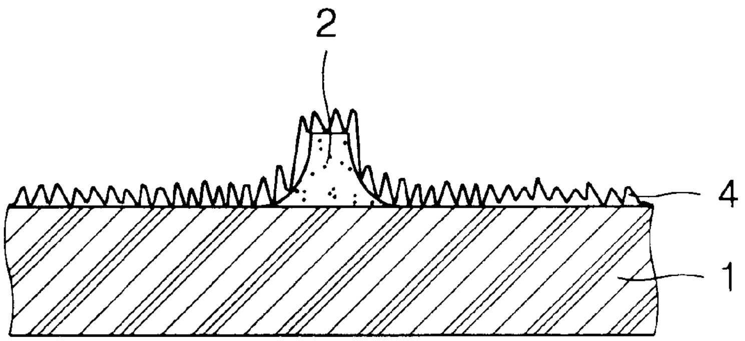
Figure 7A:
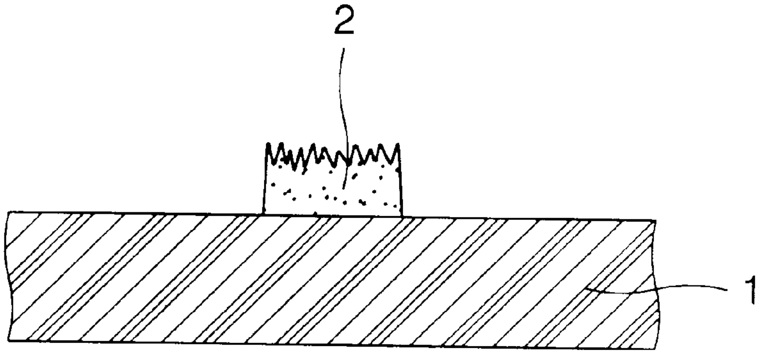
FIGS. 7A and 7B show a state in which the target layer has nano-sized surface features when the residual carbon polymer layer acts as a mask according to the method of forming a micro structure under the present invention.

If the carbon polymer layer 4 continues to be etched as shown in FIGS. 6A and 6B, the carbon polymer layer 4 is almost removed and the target layer 2 begins to be etched. Finally, the target layer 2 originally having a flat surface has nano-sized surface features as shown in FIGS. 7A and 7B.

The surface roughness of the micro structure are adjusted depending on the difference in etch rate between the micro structure and the carbon polymer layer 4. In particular, the etch rate is preferably controlled by adjusting at least one of plasma power, the $O_2$ content of the reactive gas with respect to the etch gas for etching the micro structure, or a plasma process pressure.

Figure 7B:
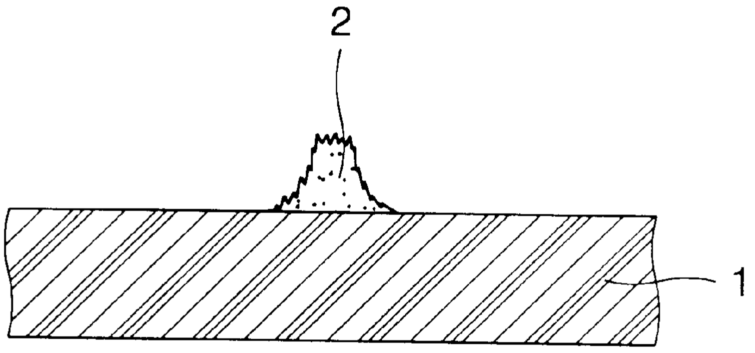
Figure 8:
FIG. 8 is an electron micrograph of the target layer formed according to the method of forming a micro structure under the present invention.

FIG. 8 is an electron micrograph showing the structure of the target layer 2 of FIG. 7B having nano-sized surface features formed on the substrate 1, which is subjected to the above process.

The method of forming a micro structure having nano-sized surface features as described above is suitable for formation of an electron emission source such as a field emission display. Furthermore, any other micro structure having nano-sized surface features can be manufactured easily by the method.

For example, according to a test conducted by the inventor of this invention, in the case of a FED device manufactured by the method of forming a micro structure as described above, a gate turn on voltage and a working voltage are reduced by about 20 V and 40–50 V, respectively, compared to a conventional FED having the same structure. Here, a working voltage refers to a voltage at which emission current of 0.3 mA is obtained at duty ratio of 1/90 and frequency of 60 Hz.

As described above, the height and surface roughness of the micro tip can be adjusted by appropriately controlling an etch rate or etch speed between the micro tip and the carbon polymer layer according to plasma process conditions. The etch rate is adjusted by controlling at least of one of plasma power, the $O_2$ content of the reactive gas with respect to the etch gas for etching the micro structure, and a plasma process pressure.

The present invention can easily give nano-sized surface features to the surface of a regularly structured micro structure. The method of forming a micro structure according to the present invention may be included in a process of forming another micro structure having a desired function. The present invention can also be applied to any structure other than FED, which requires the structure as described above.

Although this invention has been particularly shown and described with references to preferred embodiments thereof, the illustrated embodiments are only examples, and it will be understood by those skilled in the art that various changes in form and details may be made therein without departing from the spirit and scope of the invention as defined by the appended claims.

What is claimed is:

1. A method of forming a micro structure having nano-sized surface features, the method comprising the steps of:

forming a micro structure having predetermined size and shape on a substrate;

coating a carbon polymer layer on the substrate including the micro structure to a predetermined thickness;

performing a first etch on the carbon polymer layer by means of plasma etching using a reactive gas in which $O_2$ gas for etching the carbon polymer layer and a gas for etching the micro structure are mixed and forming a mask layer by the residual carbon polymer layer on the surface of the micro structure; and performing a second etch by means of plasma etching using the mixed reactive gas to remove the mask layer and etch the surface of the micro structure not covered by the mask layer so that the micro structure has nano-sized surface features.

2. The method of claim 1, wherein the carbon polymer layer is formed of polyimide or photoresist.

3. The method of claim 2, wherein the carbon polymer layer is etched using reactive ion etching (RIE).

4. The method of claim 1, wherein the carbon polymer layer is etched using reactive ion etching (RIE).

5. The method of claim 4, wherein surface characteristics of the nano-sized surface features are controlled by adjusting the difference in etch rate between the micro structure and the carbon polymer layer.

6. The method of claim 5, wherein the etch rate is adjusted by adjusting at least one of a group consisting of: plasma power, the $O_2$ content of the reactive gas with respect to the etch gas for etching the micro structure and a plasma process pressure.

7. The method of claim 4 wherein the micro structure is formed of one or a mixture of two or more material selected from the group consisting of: molybdenum (Mo), tungsten (W), silicon, and diamond, and the reactive gas is a mixture of $O_2$ gas and fluorine-family gas.

8. The method of claim 7 wherein the reactive gas comprises at least one gas selected from a group consisting of: $CF_4/O_2$, $SF_6/O_2$, $CF_4/SF_6/O_2$, $CF_4/CHF_3/O_2$, and $SF_6/CHF_3/O_2$.

9. The method of claim 4 wherein the micro structure is formed of one or a mixture of two or more materials selected from the group consisting of: molybdenum (Mo), tungsten (W), silicon, and diamond, and the reactive gas is a mixture of $O_2$gas and chlorine-family gas.

10. The method of claim 9 wherein the reactive gas comprises at least one gas selected from a group consisting of: $Cl_2/O_2$, $CCl_4/O_2$, and $Cl_2/CCl_4/O_2$.

* * * * *